(12) United States Patent
Yagi et al.

(10) Patent No.: US 11,393,945 B2
(45) Date of Patent: Jul. 19, 2022

(54) OPTICAL SEMICONDUCTOR DEVICE AND METHOD FOR MANUFACTURING OPTICAL SEMICONDUCTOR DEVICE

(71) Applicant: SUMITOMO ELECTRIC INDUSTRIES, LTD., Osaka (JP)

(72) Inventors: Hideki Yagi, Osaka (JP); Naoko Konishi, Osaka (JP); Takuo Hiratani, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 340 days.

(21) Appl. No.: 16/802,447

(22) Filed: Feb. 26, 2020

(65) Prior Publication Data
US 2020/0303903 A1    Sep. 24, 2020

(30) Foreign Application Priority Data
Mar. 22, 2019  (JP) .............................. JP2019-055072

(51) Int. Cl.
*H01L 31/18* (2006.01)
*H01L 31/0203* (2014.01)
(Continued)

(52) U.S. Cl.
CPC .... *H01L 31/1896* (2013.01); *H01L 21/76251* (2013.01); *H01L 31/0203* (2013.01);
(Continued)

(58) Field of Classification Search
CPC ... H01L 21/48–4896; H01L 21/56–568; H01L 21/76251; H01L 31/0203–02168;
(Continued)

(56) References Cited

U.S. PATENT DOCUMENTS

| | | | |
|---|---|---|---|
| 2014/0098833 A1* | 4/2014 | Kim ...................... | H01S 5/1838 372/44.011 |
| 2015/0078703 A1* | 3/2015 | Park ...................... | H01S 5/2031 977/755 |

(Continued)

OTHER PUBLICATIONS

De Groote, A., et al., "Transfer-printing-based integration of single-mode waveguide-coupled III-V-on-silicon broadband light emitters," Optics Express, vol. 24, No. 13, Jun. 27, 2016, 9 pgs.

*Primary Examiner* — Andres Munoz
(74) *Attorney, Agent, or Firm* — Volpe Koenig

(57) ABSTRACT

A method for manufacturing an optical semiconductor device, includes the steps of: forming a plurality of compound semiconductor layers including a sacrificial layer, an absorption layer, and a core layer; forming a first mesa from the plurality of compound semiconductor layers; forming an embedding layer that is a semiconductor layer having the first mesa embedded therein; after the step of forming the embedding layer, etching the sacrificial layer to form a chip including the plurality of compound semiconductor layers and the embedding layer; bonding the chip to a substrate comprising silicon and having a waveguide; and etching a portion of the first mesa of the chip bonded to the substrate to form a second mesa adjacent to the first mesa. The second mesa includes the core layer and is optically coupled to the waveguide of the substrate.

7 Claims, 8 Drawing Sheets

(51) Int. Cl.
  *H01L 21/762* (2006.01)
  *H01L 31/0232* (2014.01)
  *H01L 31/0304* (2006.01)
  *H01L 31/0352* (2006.01)
  *H01L 31/105* (2006.01)

(52) U.S. Cl.
  CPC .. *H01L 31/02327* (2013.01); *H01L 31/03046* (2013.01); *H01L 31/035281* (2013.01); *H01L 31/1844* (2013.01); *H01L 31/105* (2013.01)

(58) Field of Classification Search
  CPC ... H01L 31/0232–02327; H01L 31/105; H01L 31/18; H01L 31/1844–1848; H01L 31/1896; H01L 31/03046; H01L 31/035281
  See application file for complete search history.

(56) References Cited

U.S. PATENT DOCUMENTS

| | | | |
|---|---|---|---|
| 2016/0276517 A1* | 9/2016 | Yoshida | H01L 31/02327 |
| 2018/0203188 A1* | 7/2018 | Parker | H01L 21/76251 |
| 2018/0239089 A1* | 8/2018 | Baets | G02B 6/1228 |
| 2020/0098567 A1* | 3/2020 | Kikuchi | H01S 5/12 |
| 2020/0136341 A1* | 4/2020 | Kang | H01S 5/0217 |
| 2021/0066537 A1* | 3/2021 | Yu | H01S 5/125 |

\* cited by examiner

OPTICAL SEMICONDUCTOR DEVICE AND METHOD FOR MANUFACTURING OPTICAL SEMICONDUCTOR DEVICE

BACKGROUND OF THE INVENTION

1. Field of the Invention

The present invention relates to optical semiconductor devices and methods for manufacturing optical semiconductor devices.

2. Description of the Related Art

There is a known technique in which an optical semiconductor device is manufactured by bonding a chip such as one having a photodetector formed therein to a wafer such as a silicon wafer having a waveguide formed therein. The silicon wafer has formed therein a silicon waveguide through which light propagates. After bonding, a waveguide mesa for optical coupling to the silicon waveguide is formed in the chip (e.g., Andreas De Groote et al., "Transfer-printing-based integration of single-mode waveguide-coupled III-V-on-silicon broadband light emitters", OPTICS EXPRESS, Vol. 24, No. 13, 2016).

It is important to flatten the surface to be bonded to increase the bond strength between the chip and the wafer. However, a resist disposed on the chip may extend to the lower surface of the chip and may thus decrease the flatness of the bonding surface. On the other hand, it is necessary to accurately align the waveguide mesa and the silicon waveguide to improve the efficiency of optical coupling therebetween. However, if the bonding surface of the chip has poor flatness, the upper surface of the chip would not be flat after bonding, thus making it difficult to form the waveguide mesa with high accuracy.

SUMMARY OF THE INVENTION

Accordingly, the present invention is relating to provide an optical semiconductor device with improved bonding surface flatness and a method for manufacturing such an optical semiconductor device.

A method for manufacturing an optical semiconductor device according to one aspect of the present invention includes the steps of forming a plurality of compound semiconductor layers including a sacrificial layer, an absorption layer, and a core layer; forming a first mesa from the plurality of compound semiconductor layers; forming an embedding layer that is a semiconductor layer having the first mesa embedded therein; after the step of forming the embedding layer, etching the sacrificial layer to form a chip including the plurality of compound semiconductor layers and the embedding layer; bonding the chip to a substrate containing silicon and having a waveguide; and etching a portion of the first mesa of the chip bonded to the substrate to form a second mesa adjacent to the first mesa. The second mesa includes the core layer and is optically coupled to the waveguide of the substrate.

An optical semiconductor device according to another aspect of the present invention includes a substrate containing silicon and having a waveguide; and a chip directly bonded to the substrate and including a plurality of compound semiconductor layers and an embedding layer. The plurality of compound semiconductor layers include an absorption layer and a core layer that are adjacent to each other. The chip has a first mesa and a second mesa that are adjacent to each other. The embedding layer has the first mesa embedded therein. The second mesa includes the core layer and is optically coupled to the waveguide of the substrate.

DESCRIPTION OF THE PREFERRED EMBODIMENTS

Figure 1A:
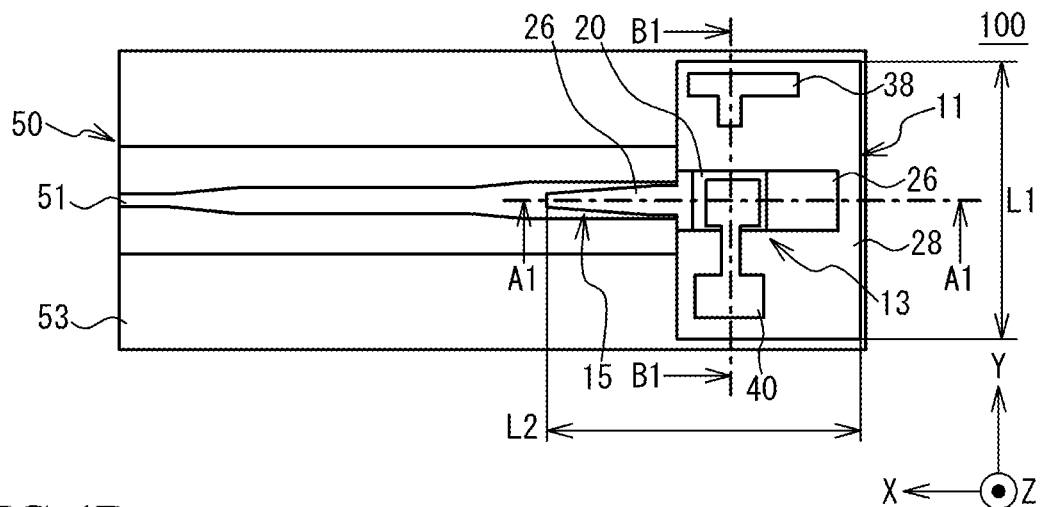
FIG. 1A is a plan view illustrating an example optical semiconductor device according to a first embodiment.

First, embodiments of the present disclosure will be listed and described below.

(1) One embodiment of the present disclosure provides a method for manufacturing an optical semiconductor device. This method includes the steps of forming a plurality of compound semiconductor layers including a sacrificial layer, an absorption layer, and a core layer; forming a first mesa from the plurality of compound semiconductor layers; forming an embedding layer that is a semiconductor layer having the first mesa embedded therein; after the step of forming the embedding layer, etching the sacrificial layer to form a chip including the plurality of compound semiconductor layers and the embedding layer; bonding the chip to a substrate containing silicon and having a waveguide; and etching a portion of the first mesa of the chip bonded to the substrate to form a second mesa adjacent to the first mesa. The second mesa includes the core layer and is optically coupled to the waveguide of the substrate. The formation of the embedding layer improves the flatness of the chip. Thus, the second mesa can be formed with high accuracy. In addition, the embedding layer functions as an encapsulation layer for etching, thereby inhibiting etching of the first mesa.

Because there is no need to provide an encapsulation layer such as a resist for covering the chip, a burr-free flat bonding surface can be obtained.

(2) The method for manufacturing an optical semiconductor device may further include, before the step of forming the chip, a step of forming, in the embedding layer, a groove through which the sacrificial layer is exposed. The first mesa may not be exposed through the groove. In the step of forming the chip, the first mesa may be covered by the embedding layer, and the sacrificial layer may be etched from a portion exposed through the groove. This allows the sacrificial layer to be etched and the first mesa to be protected by the embedding layer.

(3) The sacrificial layer may contain aluminum arsenide, and the embedding layer may contain indium phosphide. Because the embedding layer has etching selectivity to the sacrificial layer, the embedding layer functions as an encapsulation layer, thereby inhibiting etching of the compound semiconductor layers.

(4) The absorption layer and the core layer may contain gallium indium arsenide. Although the absorption layer and the core layer have no etching selectivity to the sacrificial layer, the absorption layer and the core layer are protected by the embedding layer.

(5) The second mesa may have a tapered shape that becomes thinner as the second mesa extends away from the first mesa. The second mesa and the waveguide of the substrate can be aligned to improve the optical coupling efficiency.

(6) The step of forming the plurality of compound semiconductor layers may include the substeps of forming the absorption layer above the sacrificial layer; and forming the core layer above the sacrificial layer so as to be adjacent to the absorption layer in a direction crossing a stacking direction. If the absorption layer and the core layer are adjacent to each other, light can propagate therebetween.

(7) The method for manufacturing an optical semiconductor device may further include, after the step of forming the embedding layer and before the step of forming the chip, a step of forming an electrode on the compound semiconductor layers.

(8) Another embodiment of the present disclosure provides an optical semiconductor device including a substrate containing silicon and having a waveguide; and a chip directly bonded to the substrate and including a plurality of compound semiconductor layers and an embedding layer. The plurality of compound semiconductor layers include an absorption layer and a core layer that are adjacent to each other. The chip has a first mesa and a second mesa that are adjacent to each other. The embedding layer has the first mesa embedded therein. The second mesa includes the core layer and is optically coupled to the waveguide of the substrate. Because the chip and the substrate are in contact with each other, the optical coupling efficiency is improved.

Details of Embodiments of Present Invention

A specific example of an optical semiconductor device and a method for manufacturing the optical semiconductor device according to an embodiment of the present invention will hereinafter be described with reference to the drawings. This example, however, should not be construed as limiting the invention. The invention is defined by the claims, and all changes that come within the meaning and range of equivalency of the claims are intended to be embraced therein.

First Embodiment

Optical Semiconductor Device

Figure 1B:
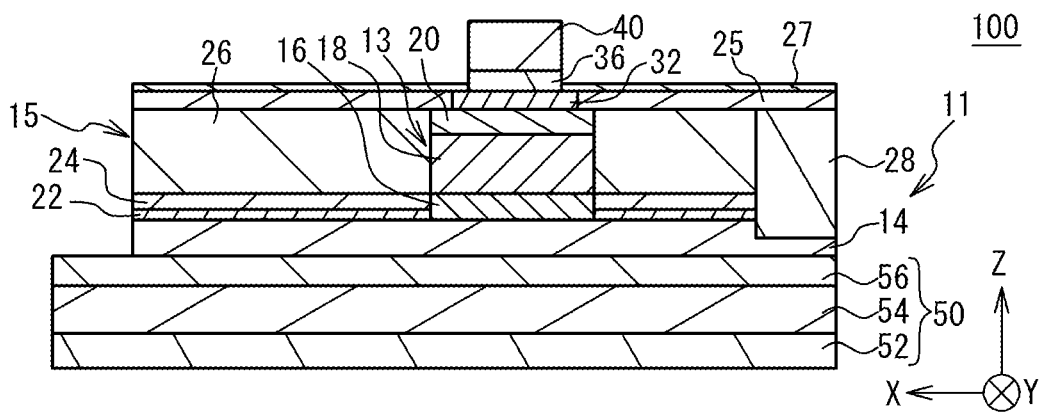
FIGS. 1B and 1C are sectional views illustrating the example optical semiconductor device.
Figure 1C:
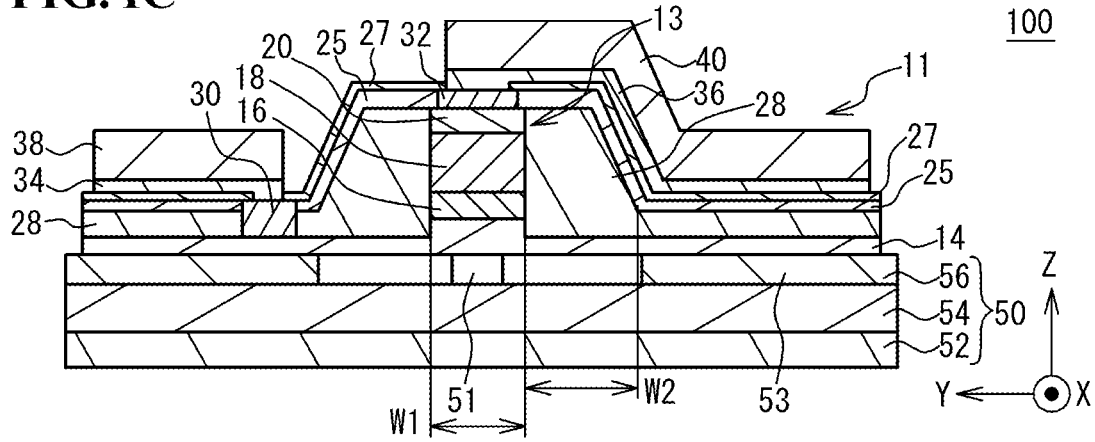

FIG. 1A is a plan view illustrating an example optical semiconductor device 100 according to a first embodiment. FIGS. 1B and 1C are sectional views illustrating the example optical semiconductor device 100. FIG. 1B illustrates a cross-section taken along line A1-A1, extending in the X direction, of FIG. 1A. FIG. 1C illustrates a cross-section taken along line B1-B1, extending in the Y direction, of FIG. 1A. As shown in FIGS. 1A to 1C, the optical semiconductor device 100 is a hybrid photodetector including a compound semiconductor chip 11 bonded to a surface of a substrate 50.

As shown in FIGS. 1B and 1C, the substrate 50 is a silicon-on-insulator (SOI) substrate in which a silicon (Si) substrate 52, a $SiO_2$ layer 54, and a Si layer 56 are stacked in sequence in the Z direction. The substrate 52 has a thickness of, for example, 500 μm. The $SiO_2$ layer 54 has a thickness of, for example, 3 μm. The Si layer 56 has a thickness of, for example, 200 nm. The Si layer 56 has a waveguide 51 and a terrace 53 formed therein. The waveguide 51 and the terrace 53 are separated from each other. The waveguide 51 extends in the X direction.

As shown in FIGS. 1A to 1C, the chip 11 includes a mesa 13 (first mesa), a mesa 15 (second mesa), and an embedding layer 28. The embedding layer 28 has the side surfaces of the mesa 13 embedded therein. The side surfaces of the mesa 13 extend, for example, in the XZ plane. The end of the mesa 13 on the +X side is not covered by the embedding layer 28. The mesa 15 is adjacent to the end of the mesa 13 on the +X side. The mesa 15 extends in the X direction and has a tapered shape that becomes thinner as the mesa 15 extends away from the mesa 13. The side surfaces of the mesa 15 are not embedded in the embedding layer 28. The mesa 15 has a high-mesa structure. The mesa 13 and the mesa 15 are located over the waveguide 51 of the substrate 50. The mesa 15 is optically coupled to the waveguide 51.

As shown in FIGS. 1B and 1C, the center of the mesa 13 in the X direction includes, in sequence from bottom (−Z side) to top (+Z side), a contact layer 14, an absorption layer 16, a cladding layer 18, and a contact layer 20. This portion functions as a photodetector.

As shown in FIG. 1B, the mesa 15 includes, in sequence from bottom to top, the contact layer 14, a buffer layer 22, a core layer 24, and a cladding layer 26. The core layer 24 is adjacent to the absorption layer 16. The +X and −X sides of the mesa 13 have the same layer structure as the mesa 15. The embedding layer 28 is disposed on the contact layer 14.

As shown in FIG. 1B, the lower surface of the contact layer 14 is the surface of the chip 11 bonded to the substrate 50 and is in contact with the upper surface of the Si layer 56. The upper surface of the contact layer 20, the upper surface of the cladding layer 26 of the mesa 15, and the upper surface of the embedding layer 28 form the same plane.

The contact layer 14 is formed of, for example, n+-type indium phosphide ((n+)-InP). The absorption layer 16 is formed of, for example, undoped gallium indium arsenide (i-GaInAs). The cladding layer 18 is formed of, for example, p-InP. The contact layer 20 is formed of, for example, (p+)-GaInAs. The buffer layer 22 is formed of, for example, i-InP. The core layer 24 is formed of, for example, i-GaInAsP. The cladding layer 26 is formed of, for example, i-InP. The embedding layer 28 is formed of, for example, iron (Fe)-doped InP. These compound semiconductor layers may also be formed of semiconductors other than those mentioned above.

The length L1 of the chip 11 in the Y direction is, for example, 250 μm. The length L2 of the chip 11, including the embedding layer 28, in the X direction is, for example, 900

μm. The width W1 of the mesa 13 in the Y direction is, for example, 9 μm. The width W2 of the embedding layer 28 on one side of the mesa 13 is, for example, 10 μm.

As shown in FIGS. 1B and 1C, insulating layers 25 and 27 are stacked on the embedding layer 28. The insulating layer 25 is formed of, for example, silicon nitride (SiN). The insulating layer 27 is formed of, for example, silicon oxynitride (SiON). The insulating layers 25 and 27 have openings at a position away from the mesa 13 toward the +Y side and above the mesa 13. The side surfaces of the mesa 15 are covered by the insulating layer 25.

As shown in FIG. 1C, an ohmic layer 30, a metal layer 34, and a plating layer 38 are stacked in sequence on the portion of the contact layer 14 exposed through the openings in the insulating layers 25 and 27, thus forming an n-type electrode. The metal layer 34 and the plating layer 38 extend from the ohmic layer 30 toward the +Y side. An ohmic layer 32, a metal layer 36, and a plating layer 40 are stacked in sequence on the mesa 13, thus forming a p-type electrode. The metal layer 36 and the plating layer 40 extend from the mesa 13 toward the −Y side. The ohmic layers 30 and 32 are composed of, for example, a stack of titanium (Ti), platinum (Pt), and gold (Au) layers. The metal layers 34 and 36 are formed of, for example, titanium-tungsten (TiW). The plating layers 38 and 40 are formed of, for example, gold (Au).

A bias voltage is applied between the p-type electrode and the n-type electrode, and light enters the waveguide 51 of the substrate 50. The light propagates through the waveguide 51 and the core layer 24 optically coupled to the waveguide 51 and is absorbed by the absorption layer 16. The optical semiconductor device 100 outputs an electrical signal depending on the light.

Method of Manufacture

FIGS. 2A to 2D, 3B to 3D, 4B to 5C, and 6B to 8A are sectional views illustrating an example method for manufacturing the optical semiconductor device 100. FIGS. 3A, 4A, 6A, 8B, and 8C are plan views illustrating the example method for manufacturing the optical semiconductor device 100. FIGS. 2A to 7B illustrate a method for manufacturing the chip 11. FIGS. 8A to 8C illustrate the bonding of the chip 11 to the substrate 50 and the subsequent steps. Although not shown, the substrate 50 is manufactured by forming the $SiO_2$ layer 54 and the Si layer 56 on a wafer substrate 52 and then forming the waveguide 51, for example, by etching the Si layer 56.

Figure 2A:
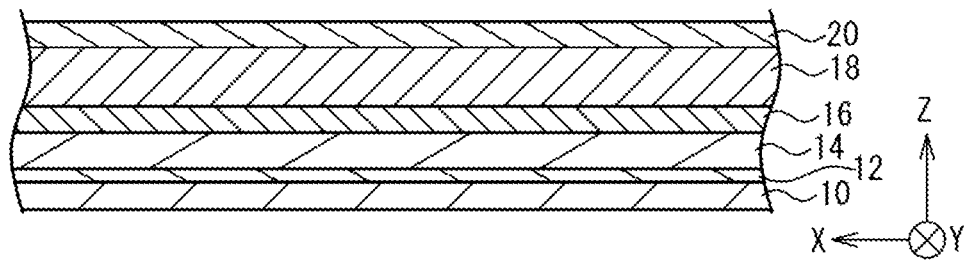
FIGS. 2A to 2D are sectional views illustrating an example method for manufacturing the optical semiconductor device.

As shown in FIG. 2A, the sacrificial layer 12, the contact layer 14, the absorption layer 16, the cladding layer 18, and the contact layer 20 are epitaxially grown in sequence on a wafer substrate 10, for example, by organometallic vapor phase epitaxy (OMVPE). The substrate 10 is, for example, a semi-insulating semiconductor substrate formed of Fe—InP. The sacrificial layer 12 is formed of, for example, aluminum indium arsenide (AlInAs).

Figure 2B:
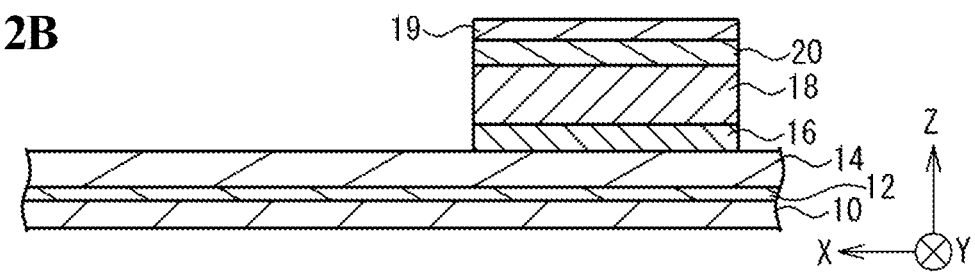

As shown in FIG. 2B, an insulating layer 19 is formed on the contact layer 20 by a process such as chemical vapor deposition (CVD). The insulating layer 19 is, for example, a SiN layer having a thickness of 200 nm. A resist pattern is transferred to the insulating layer 19 by photolithography and etching with buffered hydrofluoric acid (BHF). The absorption layer 16, the cladding layer 18, and the contact layer 20 are wet-etched with a hydrochloric acid (HCl)-based or hydrobromic acid (HBr)-based etchant using the insulating layer 19 as a mask. The contact layer 14 functions as an etch stop layer, and the contact layer 14 is exposed. The absorption layer 16, the cladding layer 18, and the contact layer 20 remain under the insulating layer 19.

Figure 2C:
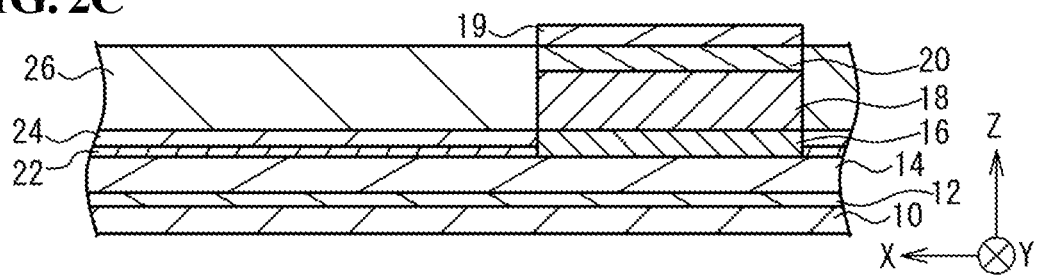
Figure 2D:
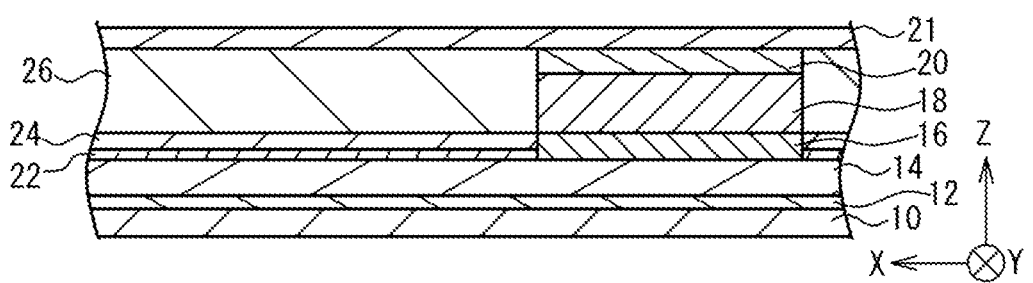

As shown in FIG. 2C, the buffer layer 22, the core layer 24, and the cladding layer 26 are epitaxially grown on the contact layer 14 by OMVPE. The absorption layer 16 and the core layer 24 are adjacent to each other. After butt-joint regrowth, the insulating layer 19 is removed with BHF. As shown in FIG. 2D, an insulating layer 21 is formed on the compound semiconductor layers by a process such as CVD. The insulating layer 21 is, for example, a SiN or $SiO_2$ layer having a thickness of 300 nm.

Figure 3A:
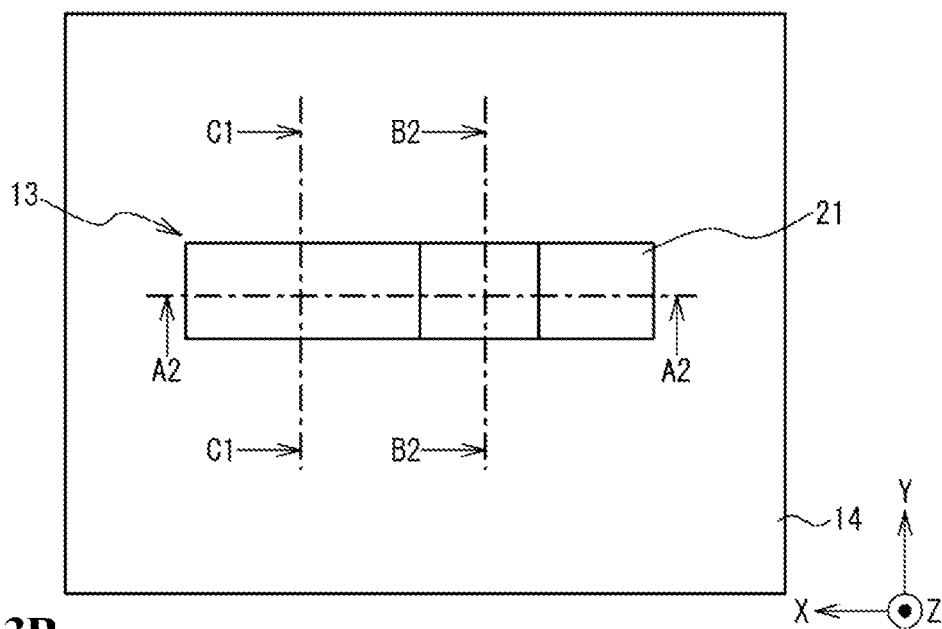
FIG. 3A is a plan view illustrating the example method for manufacturing the optical semiconductor device.
Figure 3B:
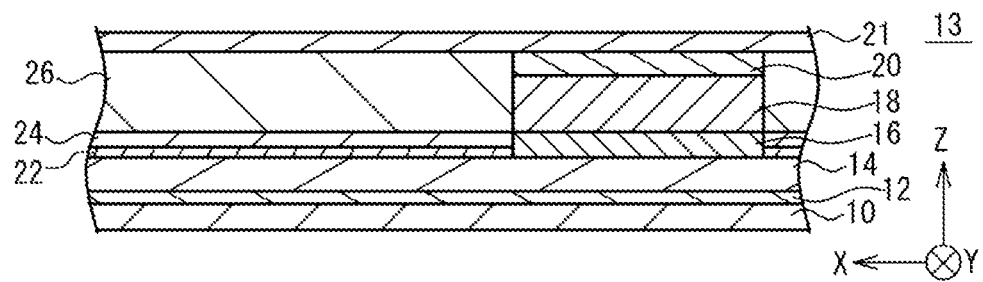
FIGS. 3B to 3D are sectional views illustrating the example method for manufacturing the optical semiconductor device.
Figure 3C:
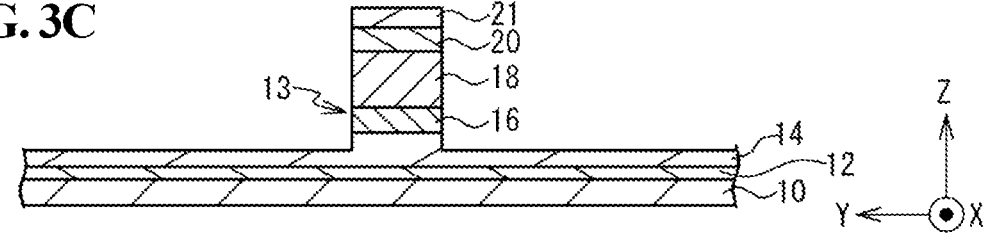
Figure 3D:
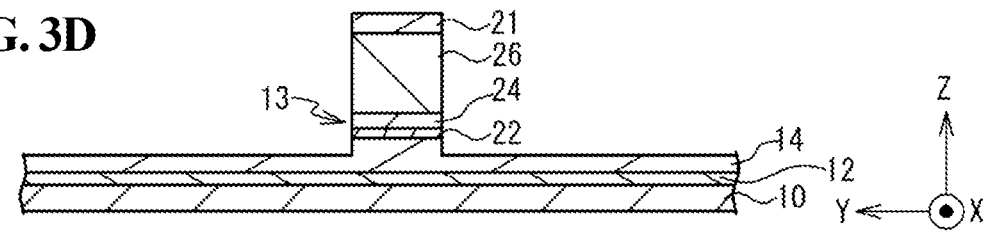

As shown in FIG. 3A, a resist pattern is formed by photolithography. The resist pattern is transferred to the insulating layer 21, for example, by reactive ion etching (ME) with carbon tetrafluoride ($CF_4$). Thus, the insulating layer 21 is formed into, for example, a rectangular shape. The mesa 13 is formed from the compound semiconductor layers by ME with a $Cl_2$-based gas using the insulating layer 21 as a mask. FIG. 3B illustrates a cross-section taken along line A2-A2 of FIG. 3A. FIG. 3C illustrates a cross-section taken along line B2-B2 of FIG. 3A. FIG. 3D illustrates a cross-section taken along line C1-C1 of FIG. 3A. As shown in FIGS. 3C and 3D, etching proceeds to a certain depth within the contact layer 14, and the contact layer 14 is exposed in the portion other than the mesa 13.

Figure 4A:
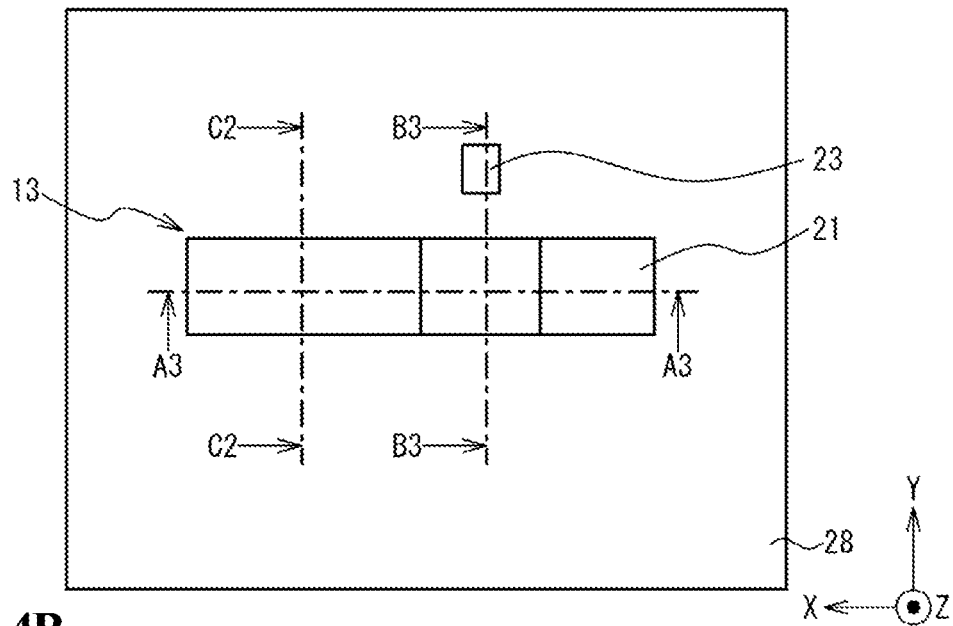
FIG. 4A is a plan view illustrating the example method for manufacturing the optical semiconductor device.
Figure 4B:
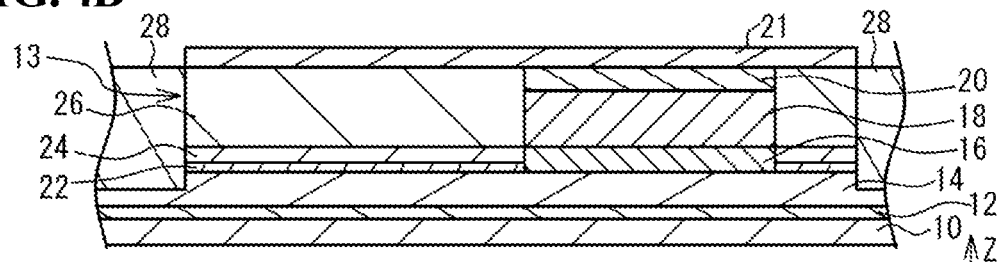
FIGS. 4B to 4D are sectional views illustrating the example method for manufacturing the optical semiconductor device.
Figure 4C:
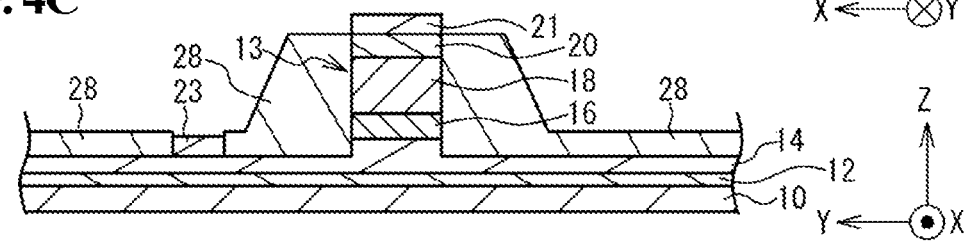
Figure 4D:
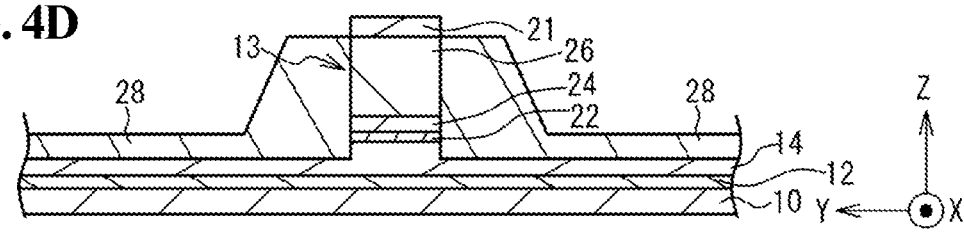

FIG. 4B illustrates a cross-section taken along line A3-A3 of FIG. 4A. FIG. 4C illustrates a cross-section taken along line B3-B3 of FIG. 4A. FIG. 4D illustrates a cross-section taken along line C2-C2 of FIG. 4A. As shown in FIGS. 4A to 4D, the insulating layer 21 remains on the mesa 13. As shown in FIGS. 4A and 4C, an insulating layer 23 is formed at a position away from the mesa 13 toward the +Y side by photolithography and BHF treatment. The insulating layer 23 is, for example, a SiN layer having a thickness of 100 nm. Any layer damaged by ME is removed, for example, by wet etching with a HCl-based etchant. The embedding layer 28 is epitaxially grown on the contact layer 14, for example, by OMVPE. As shown in FIG. 4A, the embedding layer 28 surrounds the mesa 13. The insulating layers 21 and 23 are removed, for example, with BHF.

Figure 5A:
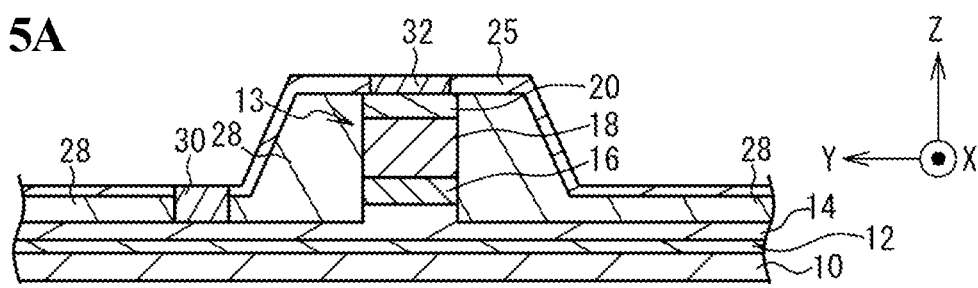
FIGS. 5A to 5C are sectional views illustrating the example method for manufacturing the optical semiconductor device.
Figure 5B:
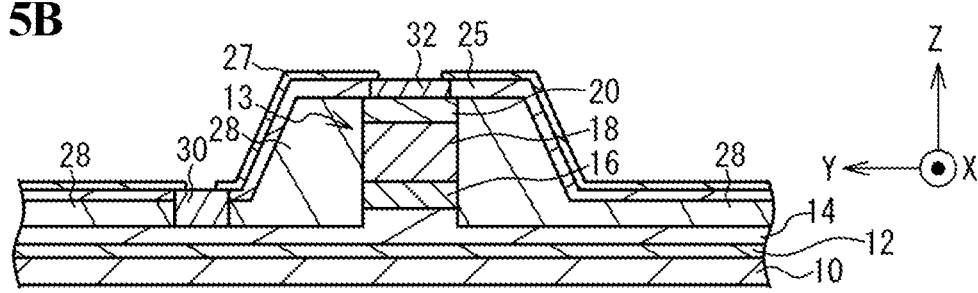

As shown in FIG. 5A, the insulating layer 25 is formed by a process such as CVD. The insulating layer 25 is, for example, a SiN layer having a thickness of 200 nm. The ohmic layers 30 and 32 are formed, for example, by evaporation and lift-off. As shown in FIG. 5B, a SiON insulating layer 27 is formed on the insulating layer 25 by a process such as CVD. A resist pattern (not shown) is formed on the insulating layer 27 by photolithography, and openings are formed in the insulating layer 27 by RIE with $CF_4$.

Figure 5C:
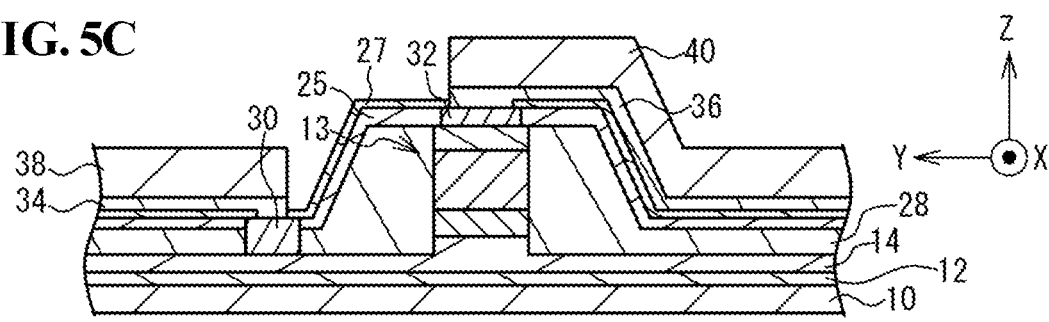

As shown in FIG. 5C, a resist pattern (not shown) is formed by photolithography, and the metal layer 34 and 36 are formed by sputtering. A resist pattern is further formed on the metal layers 34 and 36, and the plating layers 38 and 40 are formed. The unnecessary portions of the metal layers 34 and 36 are removed by RIE with sulfur hexafluoride ($SF_6$), and the resist is removed by $O_2$ ashing.

Figure 6A:
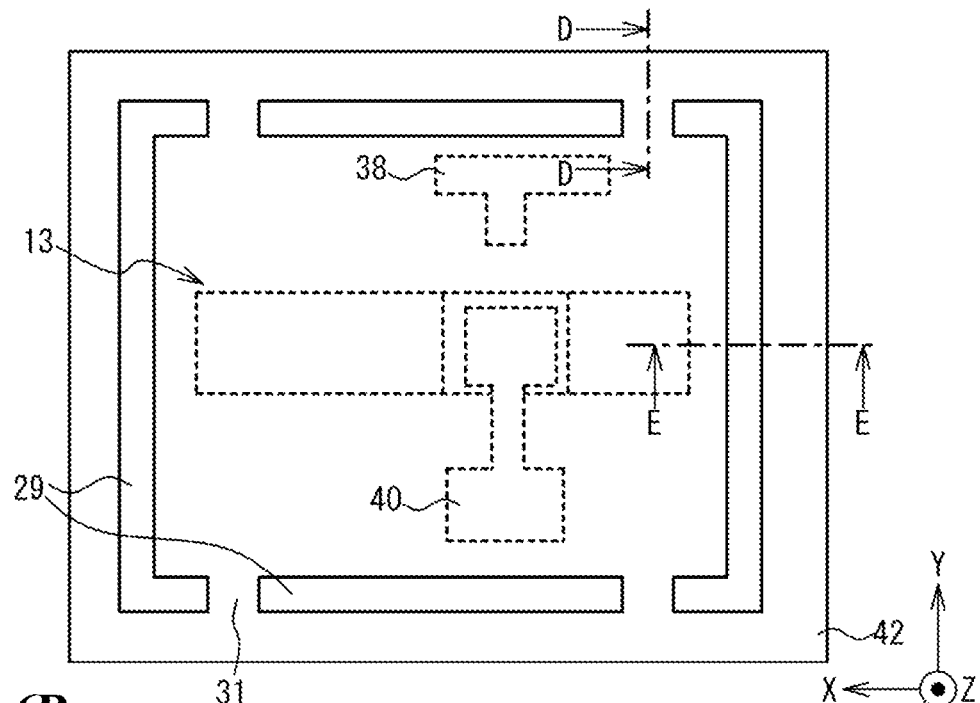
FIG. 6A is a plan view illustrating the example method for manufacturing the optical semiconductor device.

As shown in FIG. 6A, an insulating layer 42 is formed on the insulating layer 27 by a process such as CVD. The insulating layer 42 is, for example, a SiN layer having a thickness of 300 nm. A resist pattern (not shown) is formed on the insulating layer 42 by photolithography. The resist pattern is transferred to the insulating layers 42, 27, and 25 by etching with BHF. A plurality of grooves 29 are formed in the compound semiconductor layers by RIE with a $Cl_2$-based gas using the insulating layer 42 as a mask. Bridges 31 are formed between the plurality of grooves 29.

Figure 6B:
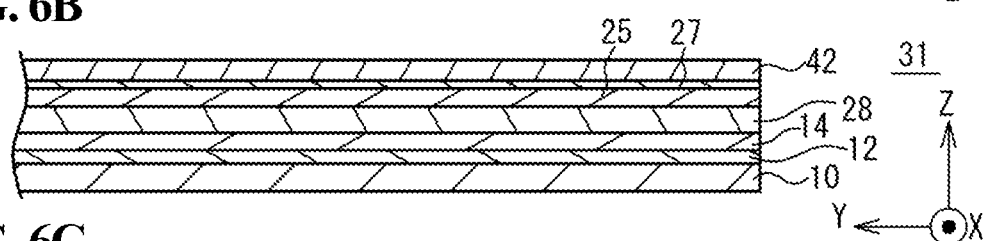
FIGS. 6B and 6C are sectional views illustrating the example method for manufacturing the optical semiconductor device.
Figure 6C:
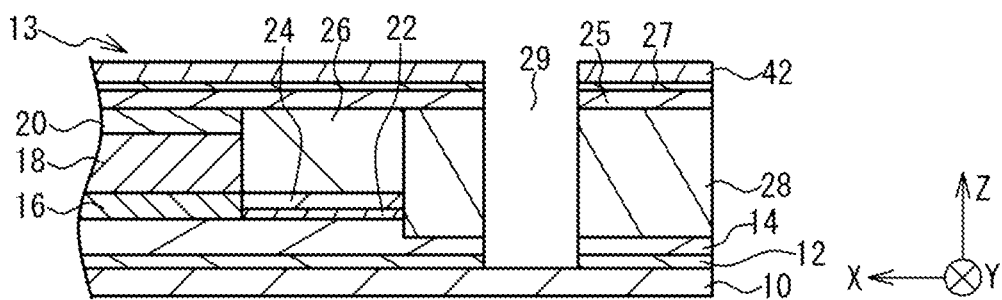

FIG. 6B illustrates a cross-section taken along line D-D of FIG. 6A and corresponds to the bridges 31. As shown in FIG. 6B, the bridges 31 are unetched portions. FIG. 6C illustrates a cross-section taken along line E-E of FIG. 6A and corresponds to portions extending across the grooves 29 into the mesa 13. As shown in FIG. 6C, the grooves 29 reach the substrate 10, and the sacrificial layer 12, the contact layer 14, and the embedding layer 28 form the inner walls of the grooves 29. The mesa 13 is not exposed in the grooves 29 and is covered by the embedding layer 28 and the insulating layer 42.

Figure 7A:
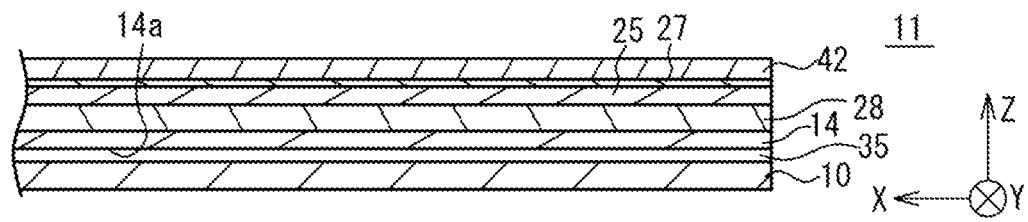
FIGS. 7A and 7B are sectional views illustrating the example method for manufacturing the optical semiconductor device.
Figure 7B:
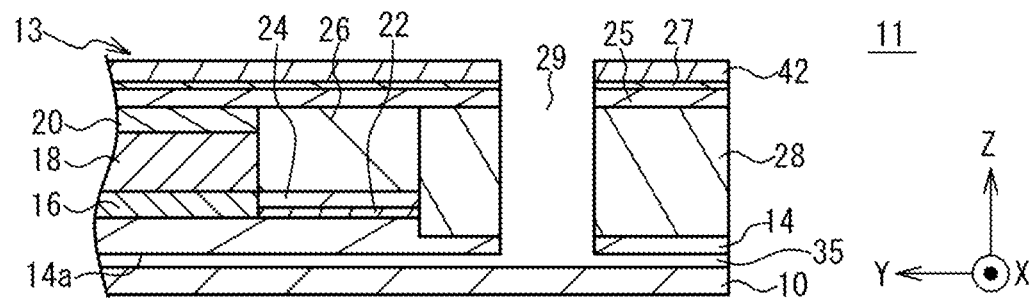
Figure 8A:
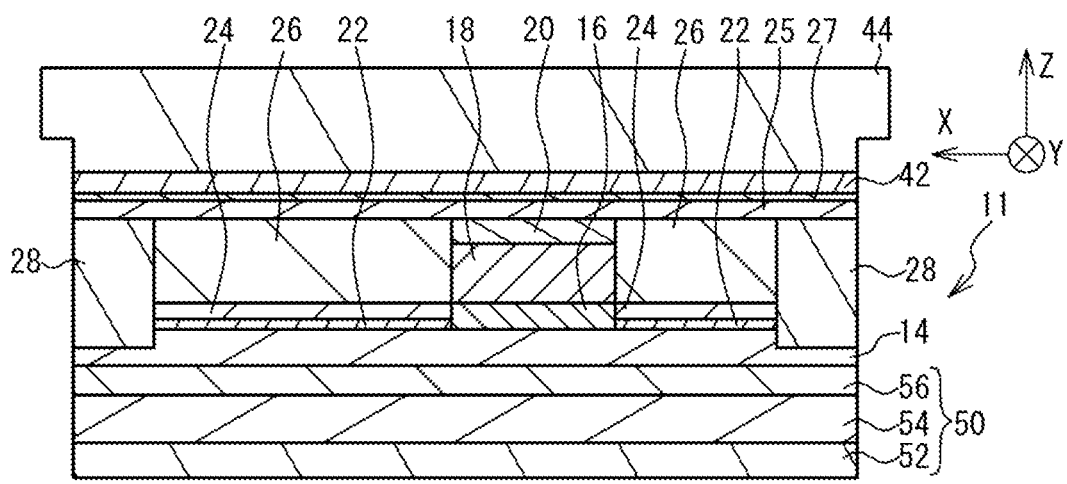
FIG. 8A is a sectional view illustrating the example method for manufacturing the optical semiconductor device.
Figure 8B:
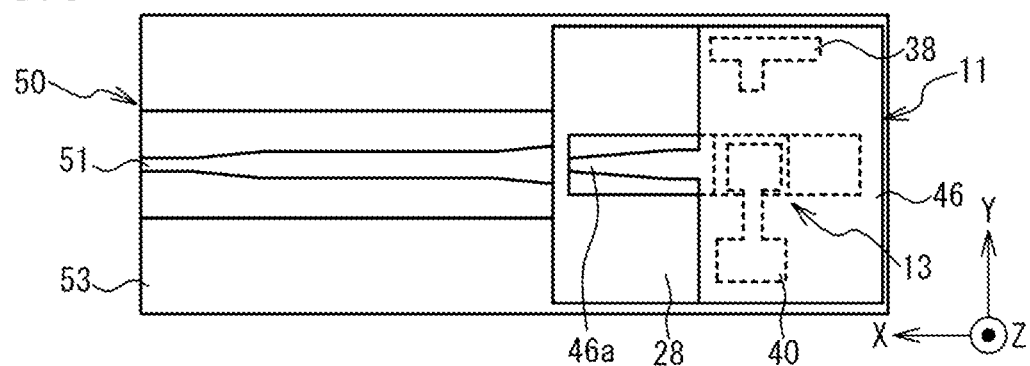
FIGS. 8B and 8C are plan views illustrating the example method for manufacturing the optical semiconductor device.
Figure 8C:
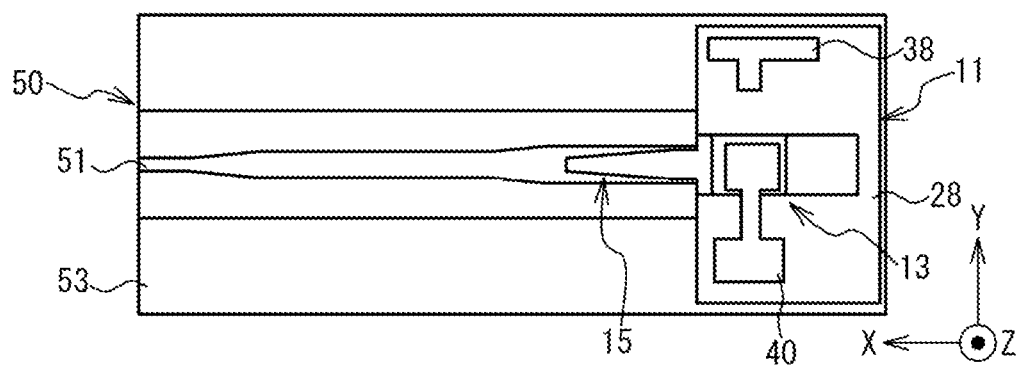

FIGS. 7A and 7B illustrate cross-sections corresponding to FIGS. 6B and 6C, respectively. As shown in FIGS. 7A and 7B, the sacrificial layer 12 is etched, for example, with an etchant containing hydrogen peroxide ($H_2O_2$). The etchant enters the grooves 29 and, upon reaching the sacrificial layer 12, removes the sacrificial layer 12 to form a cavity 35. The embedding layer 28 and the contact layer 14 remain because the embedding layer 28 and the contact layer 14 are less easily etched than the sacrificial layer 12. The mesa 13 is not etched because the mesa 13 is protected by the embedding layer 28 and the insulating layer 42. As a result of this wet etching, the mesa 13 and the embedding layer 28 are separated from the substrate 10, thus forming the chip 11. The lower surface of the chip 11 is the lower surface 14a of the contact layer 14. The chip 11 is suspended by the bridges 31 shown in FIG. 6A.

As shown in FIG. 8A, the chip 11 is picked up by a stamp (polydimethylsiloxane (PDMS)) 44 and is placed onto the surface of the substrate 50. The contact layer 14 and the Si layer 56 come into contact with each other, and the intermolecular force therebetween bonds the chip 11 and the substrate 50 together. In this transfer printing, the mesa 13 of the chip 11 is bonded so as to be located over the waveguide 51 of the substrate 50 shown in FIG. 1A. After bonding, the insulating layer 42 is removed with BHF.

As shown in FIG. 8B, an insulating layer 46 is formed on the chip 11. The insulating layer 46 is, for example, a SiN or $SiO_2$ layer having a thickness of 200 nm. A resist pattern is further formed by photolithography. The pattern is transferred to the insulating layer 46 by RIE with $CF_4$. Thus, the insulating layer 46 as shown in FIG. 8B is formed. The insulating layer 46 has a tapered projection 46a. The portion of the chip 11 on the −X side is covered by the insulating layer 46. Specifically, the portion of the mesa 13 including the absorption layer 16 (the portion under the plating layer 40) and the portion located on the −X side thereof are covered by the insulating layer 46. A portion of the +X side of the mesa 13 is covered by the projection 46a, whereas the remaining portion is exposed. The plating layers 38 and 40 are also covered by the insulating layer 46.

As shown in FIG. 8C, the portion of the chip 11 exposed from the insulating layer 46 is removed using the insulating layer 46 as a mask, for example, by RIE with a $CH_4/H_2$ gas. A portion of the mesa 13 remains, and a mesa 15 having a tapered shape is formed adjacent to the mesa 13. The insulating layer 46 is removed with BHF. By the foregoing steps, the optical semiconductor device 100 is formed.

According to the first embodiment, the embedding layer 28 having the mesa 13 embedded therein is formed, which improves the flatness of the upper surface of the chip 11 and thus allows the mesa 15 to be formed with high accuracy. Specifically, the improved flatness allows a resist pattern to be accurately formed by photolithography and also improves the accuracy of pattern transfer to the insulating layer 46 and etching using the insulating layer 46 as a mask. As a result, the mesa 15 can be formed at a position where the mesa 15 is optically coupled to the waveguide 51, thus improving the efficiency of optical coupling.

In addition, the embedding layer 28 functions as an encapsulation layer for the mesa 13 during the etching of the sacrificial layer 12, thereby inhibiting damage to the mesa 13. Because there is no need to provide a resist or other material for encapsulation, for example, no resist burr remains after the separation of the chip 11. Thus, the flatness of the bonding surface can be improved, and the likelihood of detachment of the chip 11 can be reduced. In addition, an intervening layer such as a resin layer need not be disposed between the chip 11 and the substrate 50 in order to obtain a flat bonding interface. That is, the chip 11 and the substrate 50 can be brought into contact with each other, thus improving the optical coupling efficiency.

The sacrificial layer 12 is exposed through the grooves 29 in the embedding layer 28. The etchant enters the grooves 29 and etches the sacrificial layer 12, so that the chip 11 can be formed. The mesa 13 is surrounded by the embedding layer 28. The mesa 13 is not exposed through the grooves 29 and is covered by the insulating layer 42. The embedding layer 28 and the insulating layer 42 function as an encapsulation layer, thereby inhibiting etching of the mesa 13.

The sacrificial layer 12 and the embedding layer 28 have etching selectivity to each other. For example, the sacrificial layer 12 is a compound semiconductor layer containing As, such as an AlInAs layer, whereas the embedding layer 28 contains no As and is formed of, for example, InP. While the sacrificial layer 12 is etched with a $H_2O_2$-based etchant, the etching of the embedding layer 28 can be inhibited. The sacrificial layer 12 and the embedding layer 28 can be formed of any other semiconductors that have etching selectivity to each other. Etchants other than $H_2O_2$-based etchants may also be used.

The absorption layer 16 and the core layer 24 are, for example, compound semiconductor layers containing As. In the first embodiment, the absorption layer 16 is formed of i-GaInAs, and the core layer 24 is formed of i-GaInAsP. Thus, as with the sacrificial layer 12, the absorption layer 16 and the core layer 24 are easily etched with a $H_2O_2$-based etchant. The (p+)-GaInAs contact layer 20 is also easily etched. According to the first embodiment, the mesa 13 is protected by the InP embedding layer 28, thus inhibiting etching of the compound semiconductor layers containing As. The compound semiconductor layers may also be formed of semiconductors other than those mentioned above, including, for example, III-V compound semiconductors containing elements such as Ga, In, and As and other compound semiconductors.

The mesa 15 has a tapered shape, which improves the efficiency of optical coupling to the waveguide 51. However, if the mesa 15 is formed before bonding, the chip 11 needs to be bonded with high accuracy so that the mesa 15 is located over the waveguide 51. In addition, the mesa 15 is likely to be damaged. According to the first embodiment, the mesa 15 is formed after the chip 11 is bonded to the substrate 50. The chip 11 may be bonded, for example, with sufficient accuracy for the mesa 13 to be located over the waveguide 51. In addition, the mesa 15 can be formed over the waveguide 51 with high accuracy, which improves the optical coupling efficiency. Furthermore, the likelihood of damage to the mesa 15 can be reduced. The mesa 15 is formed with an etchant that does not etch the substrate 50, such as one containing $CH_4/H_2$.

After the contact layer 14, the absorption layer 16, the cladding layer 18, and the contact layer 20 are formed, they are partially removed, and the buffer layer 22, the core layer 24, and the cladding layer 26 are formed adjacent to the remaining portion. After butt-joint regrowth, the absorption layer 16 and the core layer 24 are adjacent to each other, so that light can propagate between the waveguide 51, the core layer 24, and the absorption layer 16.

An electrode is formed on the chip 11 after the formation of the embedding layer 28 and before bonding to the substrate 50. The electrode allows the chip 11 to function as a photodetector.

What is claimed is:

1. A method for manufacturing an optical semiconductor device, comprising the steps of:
    forming a plurality of compound semiconductor layers including a sacrificial layer, an absorption layer, and a core layer;
    forming a first mesa from the plurality of compound semiconductor layers;
    forming an embedding layer that is a semiconductor layer having the first mesa embedded therein;
    after the step of forming the embedding layer, etching the sacrificial layer to form a chip including the plurality of compound semiconductor layers and the embedding layer;
    bonding the chip to a substrate comprising silicon and having a waveguide; and
    etching a portion of the first mesa of the chip bonded to the substrate to form a second mesa adjacent to the first mesa, wherein the second mesa includes the core layer and is optically coupled to the waveguide of the substrate.

2. The method for manufacturing an optical semiconductor device according to claim 1, further comprising, before the step of forming the chip, a step of forming, in the embedding layer, a groove through which the sacrificial layer is exposed, wherein the first mesa is not exposed through the groove, and
    in the step of forming the chip, the first mesa is covered by the embedding layer, and the sacrificial layer is etched from a portion exposed through the groove.

3. The method for manufacturing an optical semiconductor device according to claim 1, wherein
    the sacrificial layer comprises aluminum arsenide, and
    the embedding layer comprises indium phosphide.

4. The method for manufacturing an optical semiconductor device according to claim 3, wherein the absorption layer and the core layer comprise gallium indium arsenide.

5. The method for manufacturing an optical semiconductor device according to claim 1, wherein the second mesa has a tapered shape that becomes thinner as the second mesa extends away from the first mesa.

6. The method for manufacturing an optical semiconductor device according to claim 1, wherein the step of forming the plurality of compound semiconductor layers includes the sub steps of:
    forming the absorption layer above the sacrificial layer; and
    forming the core layer above the sacrificial layer so as to be adjacent to the absorption layer in a direction crossing a stacking direction.

7. The method for manufacturing an optical semiconductor device according to claim 1, further comprising, after the step of forming the embedding layer and before the step of forming the chip, a step of forming an electrode on the compound semiconductor layers.

* * * * *